United States Patent [19]

Tihanyi

[11] Patent Number: 5,724,218
[45] Date of Patent: Mar. 3, 1998

[54] POWER TRANSISTOR WITH SHORT-CIRCUIT PROTECTION

[75] Inventor: Jenoe Tihanyi, Kirchheim, Germany

[73] Assignee: Siemens Aktiengesellschaft, Munich, Germany

[21] Appl. No.: 721,565

[22] Filed: Sep. 26, 1996

[30] Foreign Application Priority Data

Sep. 27, 1995 [DE] Germany .................. 195 35 986.0

[51] Int. Cl.$^6$ ...................................... H02H 3/18
[52] U.S. Cl. ................................ 361/79; 361/54
[58] Field of Search ......................... 361/54, 57, 91, 361/93, 18, 79

[56] References Cited

U.S. PATENT DOCUMENTS 5,200,878  4/1993  Sasagawa et al. .............. 361/93

OTHER PUBLICATIONS

"A new IGBT with a monolithic over–current protection circuit", (Yasukazu et al.), Advanced Device Technology Laboratory, Fuji Electric Corporate R&D Ltd., Japan, Session 2, Paper 2.3, pp. 31–41.

*Primary Examiner*—Jeffrey A. Gaffin
*Assistant Examiner*—Sally C. Medley
*Attorney, Agent, or Firm*—Herbert L. Lerner; Laurence A. Greenberg

[57] ABSTRACT

Power transistors, especially MOSFETs and IGBTs, must be protected adequately in the ON state against a short circuit in the load circuit, in order to avoid their destruction. Until now, the power transistor was turned off if a short-circuit current appeared by providing that its gate-to-source path, in the event of a short circuit, was short-circuited through another transistor, and the power transistor was thus turned off. However, if that readjustment of the current took place too fast, the power transistor was able to be damaged by overvoltage. That is counteracted by a voltage sensor configuration, which detects the voltage change in the load path of the power transistor and reduces the potential at the control terminal connection of the other transistor if the output voltage rises.

10 Claims, 2 Drawing Sheets

$$U2 = f\left(\frac{\Delta U}{\Delta t}\right)$$
$$U1 = f(I)$$

$$U2 = f\left(\frac{\Delta U}{\Delta t}\right)$$
$$U1 = f(I)$$

POWER TRANSISTOR WITH SHORT-CIRCUIT PROTECTION

BACKGROUND OF THE INVENTION

1. Field of the Invention

The invention relates to a circuit configuration for short-circuit protection of a power transistor, wherein the power transistor has a load path connected between a first terminal and a second terminal as well as a control terminal connection connected to a third terminal, another transistor has a load path connected between the second terminal and the third terminal, a current sensor configuration detects a current flowing through the power transistor, and the current sensor configuration is connected on the output side to a control terminal connection of the other transistor for turning the other transistor on, as soon as a specified critical value of the current through the power transistor is exceeded.

Current limitation in the event of a short circuit is currently a problem in power electronics. Especially circuit configurations with power transistors, such as MOSFETs and IGBTs, must be protected in the ON state against an incident short circuit in the load current circuit, since in the event of a short circuit the current through the power transistor rises very rapidly to a multiple of the rated current, which threatens the power transistor and can even destroy it. In the event of a short circuit, the rate of current rise is dependent on the stray inductance of the supply lines in the load circuit. In order to avoid destruction of the power transistor, it has been known until now to turn the power transistor off quickly in the event of a short circuit, or to quickly limit the short-circuit current to harmless values.

Power transistors with short-circuit protection are described, for instance, in a publication entitled: Proceedings of the 6th International Symposium on Power Semiconductor Devices and ICs, Davos, Switzerland, May 31–Jun. 2, 1994, pp. 31–35 and 35–41. A current sensor configuration which is formed of a series circuit of a transistor and a resistor, is connected parallel to the power transistor, which is an IGBT. A junction of the transistor and the resistor is connected to a control terminal connection of a MOSFET, which has a load path connected parallel to the gate-to-source capacitance of the power transistor. The voltage drop at the resistor is a measure of the current flowing through the power transistor. As soon as the current through the power transistor exceeds a specified critical value, that voltage drop at the resistor is so great that the MOSFET turns on, the gate potential at the power transistor drops and the current flowing through the power transistor is thus reduced. The potential at the control terminal connection of the power transistor can also be lowered so far by the MOSFET of the current sensor configuration that the power transistor is turned off completely.

However, it has been found that the power transistor can be damaged in the event of a short circuit despite the known readjustment or turnoff of the current. If the current readjustment or turn-on is too fast, then an overvoltage which assumes excessively high values drops at the power transistor.

SUMMARY OF THE INVENTION

It is accordingly an object of the invention to provide a power transistor with improved short-circuit protection, which overcomes the hereinafore-mentioned disadvantages of the heretofore-known devices of this general type.

With the foregoing and other objects in view there is provided, in accordance with the invention, a circuit configuration for short-circuit protection of a power transistor. The load path of a power transistor is connected between first and second terminals. A third terminal is connected to a control terminal connection of the power transistor. The load path of another transistor is connected between the second and third terminals. A current sensor configuration detects a current flowing through the power transistor. The current sensor configuration has an output side connected to the control terminal connection of the other transistor, for turning the other transistor on as soon as a specified critical value of the current through the power transistor is exceeded. A voltage sensor configuration detects a voltage change along the load path of the power transistor. The voltage sensor configuration has an output side connected to the control terminal connection of the other transistor, for reducing a potential to be picked up at the control terminal connection of the other transistor in accordance with the detected voltage change.

In accordance with another feature of the invention, the current sensor configuration has a comparator circuit with an output supplying first and second possible output voltage signals; the first output signal is less than an inception voltage of the other transistor and is always present at the output of the comparator circuit whenever the current through the power transistor is below the critical value; and the second output signal is greater than the inception voltage of the other transistor and is always present at the output of the comparator circuit whenever the current through the power transistor is above the specified critical value.

In accordance with a further feature of the invention, the voltage sensor configuration has a further transistor and a series circuit of a capacitor and a resistor connected between the first and second terminals, the capacitor and the resistor are interconnected at a junction; the capacitor is connected to the first terminal and the resistor is connected to the second terminal; and the further transistor has a load path connected between the control terminal connection of the other transistor and the second terminal, and the further transistor has a control terminal connection connected to the junction.

In accordance with an added feature of the invention, there is provided a diode connected parallel to the capacitor, the diode having a cathode terminal connection connected to the first terminal and an anode terminal connection connected to the junction.

In accordance with an additional feature of the invention, there is provided a further diode having a cathode terminal connection connected to the third terminal and an anode terminal connection connected to the junction.

In accordance with yet another feature of the invention, there is provided a resistor connected in series between the control terminal connection of the other transistor and the output of the current sensor configuration.

In accordance with yet a further feature of the invention, there is provided a controllable resistor configuration to be increased in resistance as soon as the specified critical value of the current of the power transistor is exceeded, the controllable resistor configuration being connected to the third terminal and having a control input terminal connected to the output of the current sensor configuration.

In accordance with yet an added feature of the invention, the controllable resistor configuration includes a first terminal, a second terminal connected to the third terminal of the circuit configuration, a third terminal being the control input terminal connected to the output of the current sensor configuration, and a fourth terminal connected to the second terminal of the circuit configuration; a depletion MOSFET having a load path and a control terminal connection; a resistor connected in a series circuit with the load path of the depletion MOSFET between the first and second terminals of the controllable resistor configuration; another resistor connected between the control terminal connection of the depletion MOSFET and the second terminal of the controllable resistor configuration; and an enhancement MOSFET having a control terminal connection connected to the third terminal of the controllable resistor configuration, and having a load path connected between the control terminal connection of the depletion MOSFET and the fourth terminal of the controllable resistor configuration.

In accordance with a concomitant feature of the invention, the power transistor is a MOSFET or an IGBT.

The invention is based, in addition to the current sensor configuration, essentially on the provision of a voltage sensor configuration in order to detect the voltage change in the load path in the power transistor in the event of a short circuit. The voltage sensor configuration, which preferably furnishes a univocal function of the short-circuit current through the power transistor, is connected on the output side to the control terminal connection of the transistor connected between the second and third terminals, so that in accordance with the voltage change it can reduce the potential that can be picked up there.

According to the invention, the gate potential of the transistor is thus regulated downward by the current sensor configuration if the current flowing through the power transistor assumes overly high values, as is the case in a short circuit, for instance. In addition, however, the potential at the control terminal connection of the transistor is reset if the output voltage along the load path of the power transistor rises. Through the use of this kind of dynamic regulation of the potential at the control terminal connection of the transistor, both a current limitation and a limitation of the rate of rise of the load voltage at the output of the power transistor are established in the event of a short circuit.

Other features which are considered as characteristic for the invention are set forth in the appended claims.

Although the invention is illustrated and described herein as embodied in a power transistor with short-circuit protection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
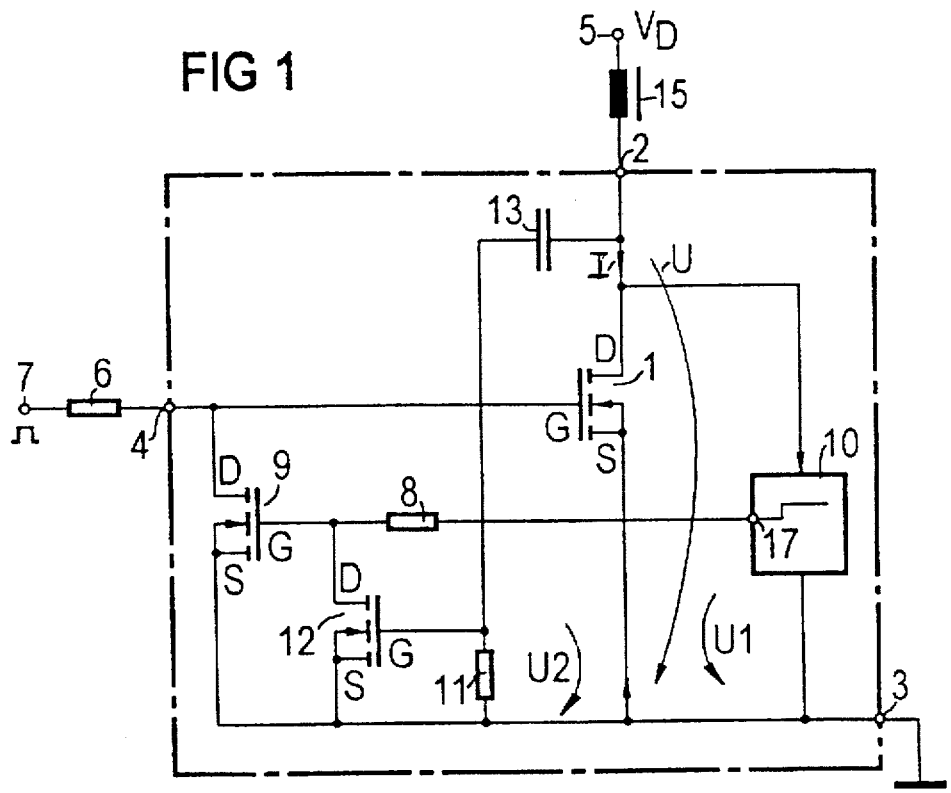
FIG. 1 is a schematic circuit diagram of a first exemplary embodiment of a power MOSFET with improved short-circuit protection.

Referring to the figures of the drawings in detail, it is noted that identical reference numerals identify identical elements having the same meaning, unless other indicated. Although a power MOSFET is used as a power transistor in the following exemplary embodiments, the present invention is not limited to such power MOSFETs. Instead of a power MOSFET, a so-called IGBT or FET may, for instance, be used as well.

Referring now, in particular, to FIG. 1 of the drawings, there is seen an exemplary embodiment of a power MOSFET 1 with improved short-circuit protection. The power MOSFET 1 has a drain terminal connection D which is in contact with a first terminal 2 and a source terminal connection S which is in contact with a second terminal 3 that is to be connected to reference potential. A gate terminal connection G of the power MOSFET 1 is connected to a third terminal 4. A resistor 6 is connected between this third terminal 4 and a further terminal 7, to which a control signal can be applied to turn the power MOSFET 1 on and off. In the exemplary embodiment of FIG. 1, a load 15 has one terminal connection connected to the first terminal 2 and another terminal connection connected to a further terminal 5. A supply voltage $V_D$, for instance of +15 V, can be applied to this terminal 5. The load 15 is shown as an inductive load 15, in the exemplary embodiment of FIG. 1. It is shown as an inductive load because stray inductances are present, at least in supply lines to the first terminal 2 and the second terminal 3.

In order to provide short-circuit protection for the power MOSFET 1, the circuit configuration shown in FIG. 1 has both a current sensor configuration and a voltage sensor configuration. The current sensor configuration is identified by reference numeral 10 in FIG. 1. This current sensor configuration 10 is connected on the input side between the drain terminal connection D and the source terminal connection S of the power MOSFET 1 and is thus connected between the first terminal 2 and the second terminal 3. The current sensor configuration 10 is a comparator circuit, for example, with two possible output signals at an output terminal 17 thereof. The output signal at the output terminal 17 is, for instance, a voltage U1 that can assume two values. The output terminal 17 is preferably connected through a resistor 8 to a control input of another transistor. In the exemplary embodiment of FIG. 1, this other transistor is an enhancement MOSFET 9, which has a drain terminal connection D connected to the third terminal 4 and a source terminal connection S connected to the second terminal 3. A gate terminal connection G of this MOSFET 9 is connected to the resistor 8. The output voltage U1, between the output terminal 17 of the current sensor configuration 10 that is constructed as a comparator circuit and the second terminal 3, can assume two values. A first value of this voltage U1 is less than an inception voltage of the MOSFET 9, and it is always present at the output terminal 17 whenever a current I through the power MOSFET 1 is below a specified critical threshold. This threshold is set in such a way that an incident short-circuit current is above this threshold. Conversely, the current I flowing through the power MOSFET 1 in rated operation is below this threshold. The output voltage U1 at the output terminal 17 of the current sensor configuration 10 can assume a second value, which is greater than the inception voltage of the power MOSFET 9. This second value is always present at the output terminal 17 of the current sensor configuration 10 whenever the current I through the power MOSFET 1 is below the specified critical threshold. The result in the event of a short circuit is that the MOSFET 9 turns on or becomes more strongly conducting, and thus the potential at the gate terminal connection G of the power MOSFET 1 drops. If the inception voltage of the MOSFET 9 is +2 V, for instance, and the specified critical threshold of the current flowing through the power MOSFET 1 is +50 A, then the current sensor configuration 10 is dimensioned in such a way that the output voltage U1 is 0 V, for instance, for an incident load current I of 5 A (rated operation). Conversely, if the load current I rises to 100 A (short-circuit situation), then the output voltage U1 at the output terminal 17 of the current sensor configuration 10 rises to +10 V, for instance, making the MOSFET 9 strongly conducting and causing the power MOSFET 1 to turn off because of the drop in potential at its gate terminal connection G.

In order to prevent overly rapid turnoff of the power MOSFET 1, because of the circuit configuration described thus far, in the event of a short circuit, and thus to prevent the occurrence of a dangerous overvoltage in the load circuit in the power MOSFET 1, a voltage sensor configuration is provided for detecting the voltage change along the load path of the power MOSFET 1. The voltage sensor configuration is connected on the output side to the gate terminal connection G of the MOSFET 9, so that the potential that can be picked up there can be reduced in accordance with the detected voltage change. In detail, in the exemplary embodiment of FIG. 1, a capacitor 13, a resistor 11 and a further enhancement MOSFET 12 are provided to construct the voltage sensor configuration. The capacitor 13 has one terminal connection connected to the first terminal 2 and another terminal connection connected to one terminal connection of the resistor 11. The resistor 11 has a still-available terminal connection connected to the second terminal 3. A junction of the capacitor 13 and the resistor 11 is connected to a gate terminal connection G of the MOSFET 12. This MOSFET 12 has a drain terminal connection D connected to the gate terminal connection G of the MOSFET 9 and a source terminal connection S connected to the second terminal 3. Both MOSFETs 9 and 12 are of the n-channel type.

The voltage sensor configuration that includes the circuit components 11, 12 and 13 detects the rate of rise in a voltage U between the drain terminal connection D and the source terminal connection S of the power MOSFET 1. A voltage U2 dropping at the resistor 11 controls the MOSFET 12. If this voltage U2 is less than the inception voltage of the MOSFET 12, then the MOSFET remains off, and no change in potential ensues at the gate terminal connection G of the MOSFET 9. Conversely, if the voltage U2 is greater than the inception voltage of the MOSFET 12, this MOSFET becomes conducting, and the potential at the gate terminal connection G of the MOSFET 9 is thus reset. The voltage sensor configuration, which includes the resistor 11, the MOSFET 12 and the capacitor 13, is dimensioned in such a way that if there is a very fast voltage rise in the voltage U, the MOSFET becomes conducting, and thus the potential at the gate terminal connection G of the MOSFET is in fact reset. The result is an increase in potential at the gate terminal connection G of the power MOSFET 1. Thus through the use of this circuit configuration presented in FIG. 1, in the event of a short circuit, both a current limitation and a limitation of the rate of rise of the output voltage are assured. The entire closed-loop control operation takes place only in the event of a short circuit, since it is understood that in normal function and thus at rated current, the output voltage U1 of the sensor configuration 10 is below the inception voltage of the MOSFET 9, and thus this MOSFET is turned off anyway.

Figure 2:
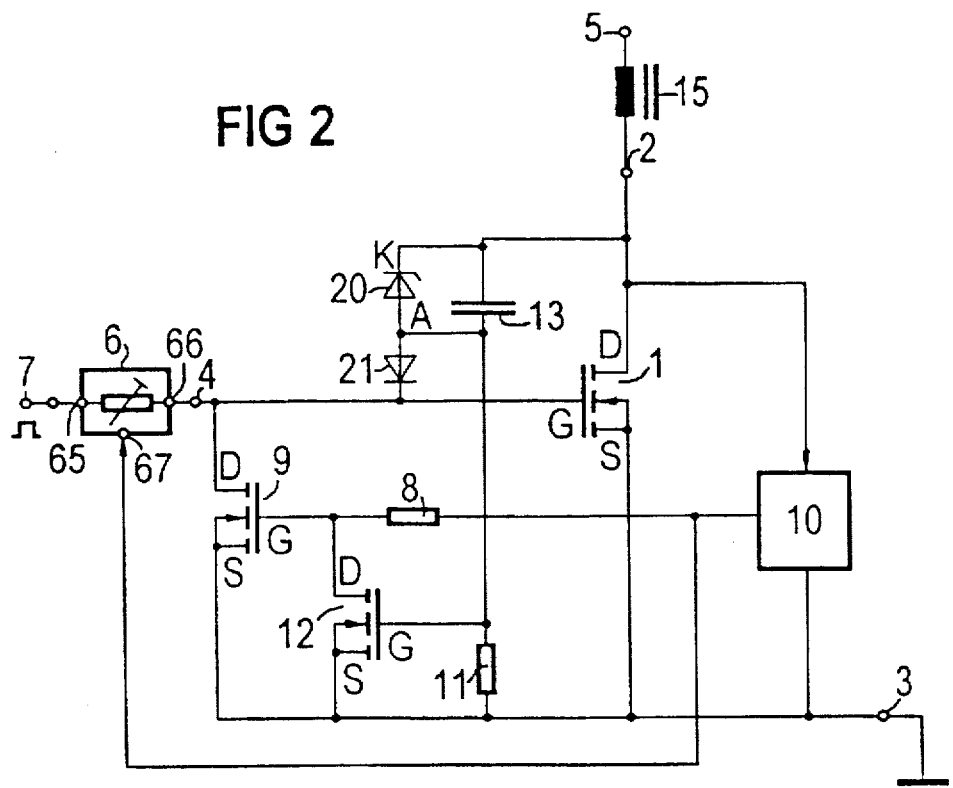
FIG. 2 is a circuit diagram of a second exemplary embodiment of a power MOSFET with improved short-circuit protection and with a controllable input resistor.

FIG. 2 shows a further feature of the circuit configuration shown in FIG. 1. The resistor 6 is constructed as a variable resistor configuration, as is shown, for instance, in FIG. 3. This variable resistor configuration 6 is constructed in such a way that in normal operation, the resistance of this resistor configuration has a specified magnitude. Conversely, if the short-circuit situation arises, the resistance of this resistor configuration 6 is increased. To that end, the output terminal 17 of the current sensor configuration 10 is connected to a terminal 67 which acts as a control terminal connection of the resistor configuration 6. An input-side terminal 65 is connected to the already-mentioned terminal 7, and an output-side terminal 66 is connected to the terminal 4.

Figure 3:
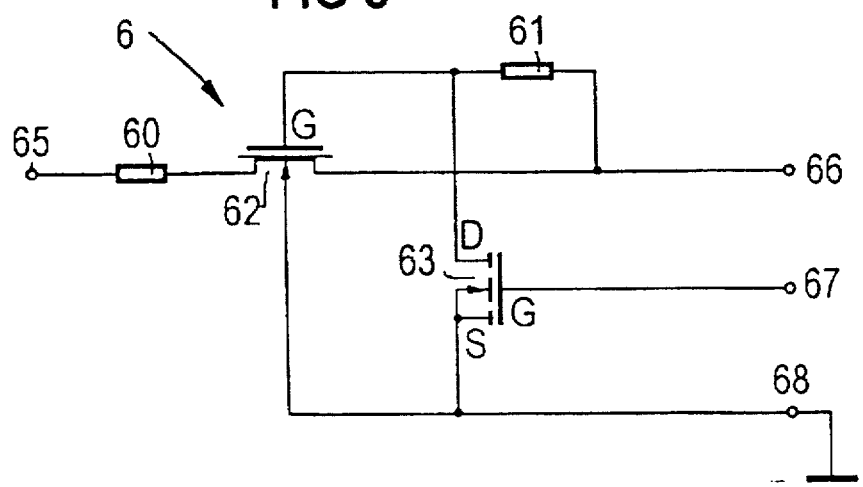
FIG. 3 is a diagram of an exemplary embodiment of a circuit configuration of the controllable resistor of FIG. 2.

FIG. 3 shows one possible embodiment of the controllable resistor configuration 6. A series circuit of a resistor 60 and a load path of a depletion MOSFET 62 is connected between the first and second terminals 65 and 66. A gate terminal connection of this depletion MOSFET 62 is connected through a further resistor 61 to the terminal 66. The gate terminal connection of the depletion MOSFET 62 is also connected through a load path of an enhancement MOSFET 63 to a terminal fourth 68. This terminal 68 is to be connected to reference potential, and therefore to the terminal 3 of the circuit configuration of FIG. 1 or FIG. 2. A substrate terminal connection of the depletion MOSFET 62 is also connected to this terminal 68. A gate terminal connection G of the enhancement MOSFET 63 is in contact with the third terminal 67 that acts as a control input.

In addition to the circuit configuration presented in FIG. 1, the circuit configuration shown in FIG. 2 also has first and second diodes 20, 21 for overvoltage protection of the circuit configuration. To that end, the first diode is a Zener diode 20 having a cathode terminal connection K connected to the first terminal 2 and an anode terminal connection A connected to the junction of the capacitor 13 and the resistor 11. The second diode 21 has a cathode terminal connection K connected to the gate terminal connection G of the power MOSFET 1 and an anode terminal connection A connected to the anode terminal connection of the Zener diode 20.

The circuit configurations shown in FIGS. 1, 2, and 3 may be constructed either discretely or integrated in a semiconductor body. In the event of integration into a semiconductor body, it is recommended that all of the resistors 6, 8, 60, 61 be constructed as depletion MOSFETs. The diodes 20, 21 may be constructed as MOSFETs.

It should be noted in conjunction with FIG. 2 that the control signal at the terminal 67 of the controllable resistor configuration 6 need not necessarily be identical to the output voltage U1 of the current sensor configuration 10. On the contrary, a device may be provided, between the terminal 67 of the controllable resistor configuration 6 and the output terminal 17 of the current sensor configuration 10, that generates a control signal suitable for the controllable resistor configuration 6, in order to increase its resistance as soon as an output signal which signals the short-circuit situation occurs at the output terminal 17 of the current sensor configuration 10.

I claim:

1. A circuit configuration for short-circuit protection of a power transistor, comprising:
    a) first and second terminals between which a load path of a power transistor is connected, and a third terminal connected to a control terminal connection of the power transistor;
    b) another transistor having a load path connected between said second and third terminals and having a control terminal connection;
    c) a current sensor configuration for detecting a current flowing through the power transistor, said current sensor configuration having an output side connected to the control terminal connection of said other transistor, for turning said other transistor on as soon as a specified critical value of the current through the power transistor is exceeded; and d) a voltage sensor configuration for detecting a voltage change along the load path of the power transistor, said voltage sensor configuration having an output side connected to the control terminal connection of said other transistor, for varying a potential at the control terminal connection of said other transistor in accordance with the detected voltage change.

2. The circuit configuration according to claim 1, wherein:

said current sensor configuration has a comparator circuit with an output supplying first and second possible output voltage signals;

the first output signal is less than an inception voltage of said other transistor and is always present at the output of said comparator circuit whenever the current through the power transistor is below the critical value; and the second output signal is greater than the inception voltage of said other transistor and is always present at the output of said comparator circuit whenever the current through the power transistor is above the specified critical value.

3. The circuit configuration according to claim 1, wherein:

said voltage sensor configuration has a further transistor and a series circuit of a capacitor and a resistor connected between said first and second terminals, said capacitor and said resistor are interconnected at a junction;

said capacitor is connected to said first terminal and said resistor is connected to said second terminal; and said further transistor has a load path connected between the control terminal connection of said other transistor and said second terminal, and said further transistor has a control terminal connection connected to the junction.

4. The circuit configuration according to claim 3, including a diode connected parallel to said capacitor, said diode having a cathode terminal connection connected to said first terminal and an anode terminal connection connected to the junction.

5. The circuit configuration according to claim 4, including a further diode having a cathode terminal connection connected to said third terminal and an anode terminal connection connected to the junction.

6. The circuit configuration according to claim 1, including a resistor connected in series between the control terminal connection of said other transistor and the output of said current sensor configuration.

7. The circuit configuration according to claim 1, including a controllable resistor configuration to be increased in resistance as soon as the specified critical value of the current of the power transistor is exceeded, said controllable resistor configuration being connected to said third terminal and having a control input terminal connected to the output of said current sensor configuration.

8. The circuit configuration according to claim 7, wherein said controllable resistor configuration includes:

a first terminal, a second terminal connected to said third terminal of the circuit configuration, a third terminal being said control input terminal connected to the output of said current sensor configuration, and a fourth terminal connected to said second terminal of the circuit configuration;

a depletion MOSFET having a load path and a control terminal connection;

a resistor connected in a series circuit with the load path of said depletion MOSFET between said first and second terminals of said controllable resistor configuration;

another resistor connected between the control terminal connection of said depletion MOSFET and said second terminal of said controllable resistor configuration; and an enhancement MOSFET having a control terminal connection connected to said third terminal of said controllable resistor configuration, and having a load path connected between the control terminal connection of said depletion MOSFET and said fourth terminal of said controllable resistor configuration.

9. The circuit configuration according to claim 1, wherein the power transistor is a MOSFET.

10. The circuit configuration according to claim 1, wherein the power transistor is an IGBT.

* * * * *